United States Patent [19]
Izumi

[11] Patent Number: 5,459,639
[45] Date of Patent: Oct. 17, 1995

[54] PRINTED CIRCUIT BOARD ASSEMBLY HAVING HIGH HEAT RADIATION PROPERTY

[75] Inventor: Shigeichi Izumi, Kawasaki, Japan

[73] Assignee: Fujitsu Limited, Kanagawa, Japan

[21] Appl. No.: 193,697

[22] Filed: Feb. 8, 1994

[30] Foreign Application Priority Data

Sep. 17, 1993 [JP] Japan .................. 5-231497

[51] Int. Cl.⁶ .................... H05K 7/20
[52] U.S. Cl. .................. 361/707; 174/252; 257/713; 361/719
[58] Field of Search ............... 165/80.3, 80.4, 165/185, 104.33; 174/15.3, 16.3, 252; 257/706, 707, 713, 714, 720; 361/689, 699, 700, 702, 704, 705, 707, 709, 711, 718, 719, 722, 749, 761, 764, 792, 795

[56] References Cited

U.S. PATENT DOCUMENTS

| | | | |
|---|---|---|---|
| 4,630,172 | 12/1986 | Stenerson | 361/386 |
| 4,890,152 | 12/1989 | Hirata | 357/72 |
| 4,922,376 | 5/1990 | Pommer | 361/386 |
| 4,931,908 | 6/1990 | Boucard | 361/761 |
| 5,012,386 | 4/1991 | McShane | 361/386 |
| 5,014,114 | 5/1991 | Heckaman | 357/74 |
| 5,173,844 | 12/1992 | Adachi | 361/764 |
| 5,297,006 | 3/1994 | Mizukoshi | 361/704 |

FOREIGN PATENT DOCUMENTS

4-260396  9/1992  Japan ................. 361/761

*Primary Examiner*—Gerald P. Tolin

[57] ABSTRACT

A printed circuit board assembly wherein a plurality of electronic parts including a heat generating part are mounted on a printed circuit board. At a portion of the printed circuit board at which the heat generating part is to be mounted, a recess is formed and a through-hole is formed substantially at the center of a bottom wall of the recess. A heat radiation member has a projection fitted in the through-hole of the printed circuit board, and a mounting portion provided around the projection for contacting with the bottom wall of the recess of the printed circuit board and securely mounted on the bottom face of the recess by means of solder. The rear face of a package of the heat generating part is securely mounted on the heat radiation member by means of solder.

8 Claims, 7 Drawing Sheets

PRINTED CIRCUIT BOARD ASSEMBLY HAVING HIGH HEAT RADIATION PROPERTY

BACKGROUND OF THE INVENTION

1. Field of the Invention

This invention relates to a printed circuit board assembly of the type wherein a plurality of electronic parts including a heat generating part are mounted on a printed circuit board, and more particularly to an improved printed circuit board assembly wherein heat generated from a heat generating part is radiated efficiently.

2. Description of the Related Art

In recent years, as high integration of integrated circuits (ICs and LSIs) and high density mounting of electronic parts proceed, the amount of heat generated from a printed circuit board assembly, which is used in electronic apparatus such as communication apparatus, progressively increases, and therefore, stable and efficient heat radiation must be achieved. A popularly known one of conventional structures of a printed circuit board assembly for which a special measure is taken for heat radiation involves a heat radiation fin mounted on an upper face of a package of a heat generating part such as an LSI mounted on a printed circuit board.

This structure, however, is disadvantageous in that the thickness of the printed circuit board assembly is increased by the heat radiation fin and it is difficult to minimize the printed circuit board assembly. Thus, another improved structure has been proposed wherein a through-hole is formed at a portion of a printed circuit board at which a heat generating part is to be mounted and a heat radiation plate made of a metal is mounted on the rear face of the printed circuit board in such a manner as to close up the through-hole and then the heat generating part is fitted into the through-hole to mount the same onto the printed circuit board while a thermal compound is filled between the package of the heat generating part and the heat radiation plate to transmit and radiate heat to and from the heat radiation plate.

Even with the improved structure, however, there is a problem in that the thermal compound filled between the package of the heat generating part and the heat radiation plate is deteriorated as time passes and stable heat radiation cannot be assured for a long period of time. Further, since the heat radiation plate is mounted on the rear face of the printed circuit board, there is another problem in that minimization of the printed circuit board assembly is still difficult due to the thickness of the heat radiation plate. Furthermore, since the through-hole is formed in the printed circuit board and a circuit pattern cannot be formed at the location of the through-hole on the printed circuit board, there is a further problem in that the wiring efficiency of the printed circuit board is low.

SUMMARY OF THE INVENTION

It is therefore an object of the present invention to provide a printed circuit board assembly which has a stable and efficient heat radiation property with respect to time without making it difficult to minimize the printed circuit board assembly.

It is another object of the present invention to provide a printed circuit board assembly which can minimize possible reduction of the wiring efficiency arising from employment of a heat radiation structure.

In accordance with an aspect of the present invention, there is provided a printed circuit board assembly, which comprises a printed circuit board having a recess formed thereon and having a first through-hole formed substantially at the center of a bottom wall of the recess, a heat radiation member mounted in the recess of the printed circuit board, the heat radiation member having a projection for being fitted in the first through-hole of the printed circuit board and a mounting portion provided around the projection for contacting with the bottom wall of the recess, and a heat generating part soldered to the heat radiation member.

The heat radiation member may be made of a metal or a ceramics which has a high heat conductivity. The heat radiation member may be securely mounted, at the mounting portion thereof, on the bottom wall of the recess of the printed circuit board by means of solder or a silver epoxy bonding agent. The printed circuit board may be formed from a flexible printed circuit board in the form of a sheet made of a flexible material.

According to the structure of the present invention, since the heat generating part is securely mounted on the heat radiation member by means of solder without employing a thermal compound as in the prior art, possible deterioration of the heat radiation property of the portion of the printed circuit board assembly as time passes is reduced. Preferably, the printed circuit board has a conductor layer formed in the inside thereof and partially exposed to the bottom wall of the recess of the printed circuit board, and the heat radiation member has a plurality of second through-holes formed in the mounting portion thereof. Consequently, heat can be radiated also by way of the conductor layer, and accordingly, the heat radiation property is enhanced.

Preferably, the printed circuit board has first wiring patterns formed in the inside thereof, the first wiring patterns including a ground pattern and a signal pattern, one of which is partially exposed to the bottom wall of the recess of the printed circuit board, and the heat radiation member has second wiring patterns which complement the first wiring patterns. In this instance, the second wiring patterns of the heat radiation member may be disposed on a surface of the heat radiation member with a glass epoxy resin layer interposed therebetween, and therefore the second wiring patterns of the heat radiation member may be disposed as multilayer patterns on the surface and in the inside of the heat radiation member. Due to the above construction, possible deterioration of the wiring efficiency which arises from the fact that the recess and the first through-hole are formed in the printed circuit board can be reduced.

The above and other objects, features and advantages of the present invention and the manner of realizing them will become more apparent, and the invention itself will best be understood, from a study of the following description and appended claims with reference to the attached drawings showing some preferred embodiment of the invention.

DESCRIPTION OF THE PREFERRED EMBODIMENTS

In the following, preferred embodiments of the present invention will be described in detail with reference to the accompanying drawings.

First Embodiment

Figure 1:
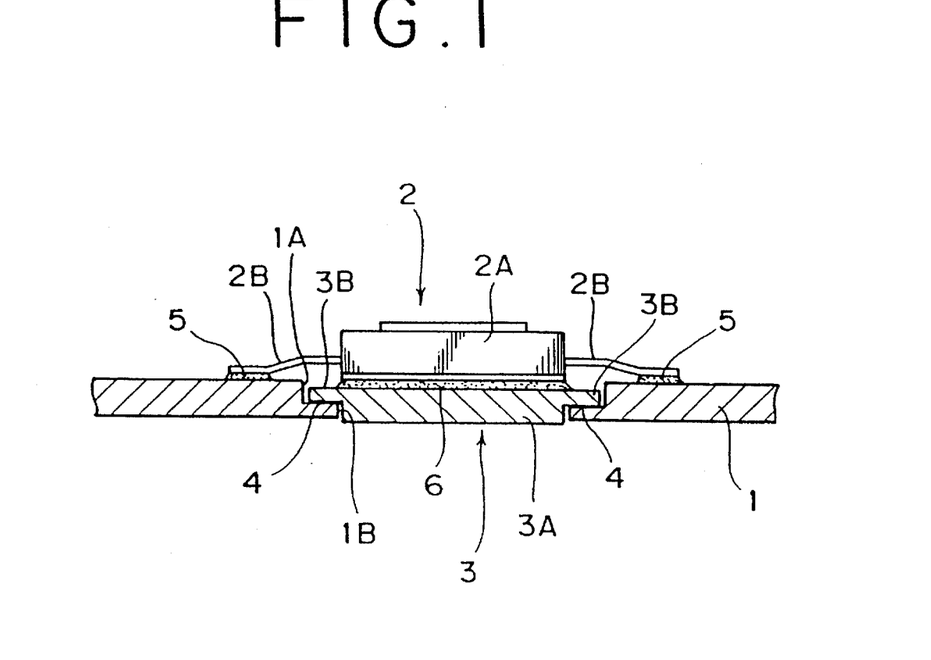
FIG. 1 is a schematic sectional view of a printed circuit board assembly showing a first preferred embodiment of the present invention.

FIG. 1 shows a printed circuit board assembly according to a first preferred embodiment of the present invention. Referring to FIG. 1, reference numeral 1 denotes a printed circuit board formed as a plate by laminating a copper foil or a copper pattern and an epoxy resin. The printed circuit board 1 has a recess 1A formed at a location thereof at which a heat generating part is to be mounted and further has a through-hole (first hole) 1B formed substantially at the center of a bottom wall of the recess 1A. Reference numeral 2 denotes an LSI (heat generating part) mounted on the printed circuit board 1. The LSI 2 has a rectangular package 2A and a plurality of leads 2B extending from side faces of the package 2A. The recess 1A and the through-hole 1B of the printed circuit board 1 are provided corresponding to the package 2A at the position at which the LSI 2 is to be mounted.

Reference numeral 3 denotes a heat radiation member made of a metal having a high heat conductivity such as aluminum (Al) or copper (Cu). The heat radiation member 3 has a projection 3A extending through the through-hole 1B of the printed circuit board 1 and a mounting portion 3B provided around the projection 3A for contacting with the bottom face of the recess 1A. The face of the heat radiation member 3 remote from the projection 3A is formed as a flat face which is substantially in register with the surface of the printed circuit board 1, and the rear face of the package 2A of the LSI 2 is adhered to the face of the heat radiation member 3. Further, the end face of the projection 3A of the heat radiation member 3 is formed as a flat face which is substantially in register with the rear face of the printed circuit board 1.

The heat radiation member 3 is disposed such that the projection 3A thereof extends through the through-hole 1B of the printed circuit board 1 and the mounting portion 3B contacts with the bottom face of the recess 1A of the printed circuit board 1, and the mounting portion 3B of the heat radiation member 3 is secured to the bottom face of the recess 1A of the printed circuit board 1 by means of solder 4 to mount the heat radiation member 3 on the printed circuit board 1. The LSI 2 is mounted onto the printed circuit board 1 such that, while the leads 2B are positioned at predetermined lands (wiring patterns) on the surface of the printed circuit board 1, the leads 2B are soldered to the lands by means of solder 5 and the package 2A is secured to the heat radiation member 3 by means of solder 6.

It is to be noted that the heat radiation member 3 may alternatively be formed from some other metal than the metals mentioned hereinabove or may otherwise be formed from a ceramics having a high heat conductivity such as alumina ceramics. Meanwhile, for mounting of the heat radiation member 3 onto the printed circuit board 1, an Ag (silver) epoxy resin bonding agent may be used in place of the solder 4 mentioned hereinabove.

Further, for mounting of the heat radiation member 3 onto the printed circuit board 1, though not shown, the heat radiation member 3 may be secured at the mounting portion 3B thereof to the printed circuit board 1 by means of screws, or otherwise, the mounting portion 3B of the heat radiation member 3 may be resiliently pressed against the bottom face of the recess 1A of the printed circuit board 1 by means of leaf springs disposed fixedly on the printed circuit board 1 by means of screws or the like to secure the heat radiation member 3 to the printed circuit board 1. Further, while, in the present embodiment, a popular printed circuit board formed as a plate by lamination of a copper foil or a copper pattern and an epoxy resin is used as the printed circuit board, alternatively a flexible printed circuit board wherein wiring patterns are formed on a surface or in the inside of a flexible film made of a celluloid material or a polyimide material may be employed.

Second Embodiment

Figure 2:
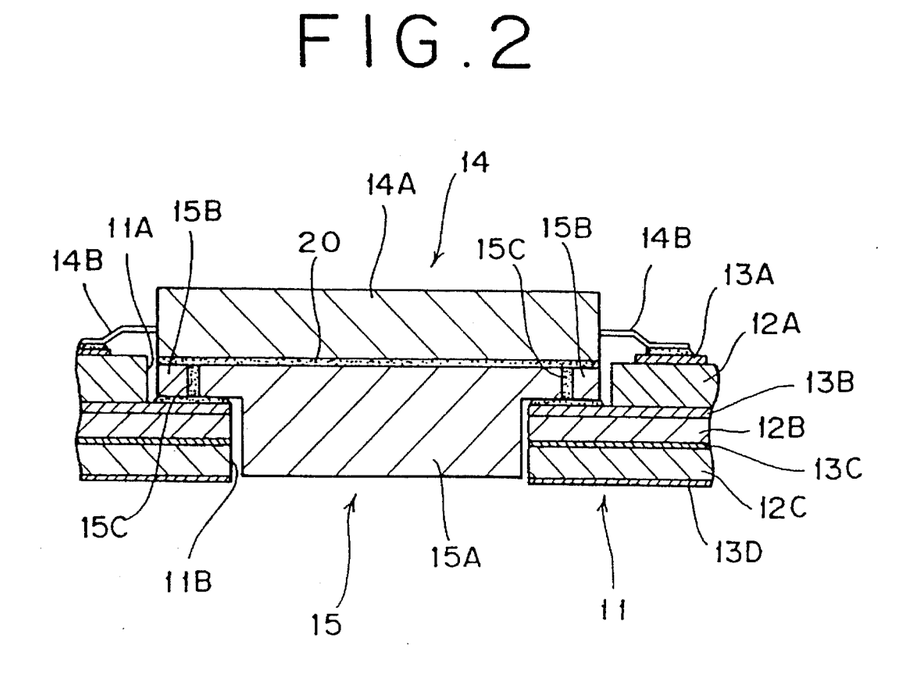
FIG. 2 is a schematic sectional view of another printed circuit board assembly showing a second preferred embodiment of the present invention.
Figure 3:
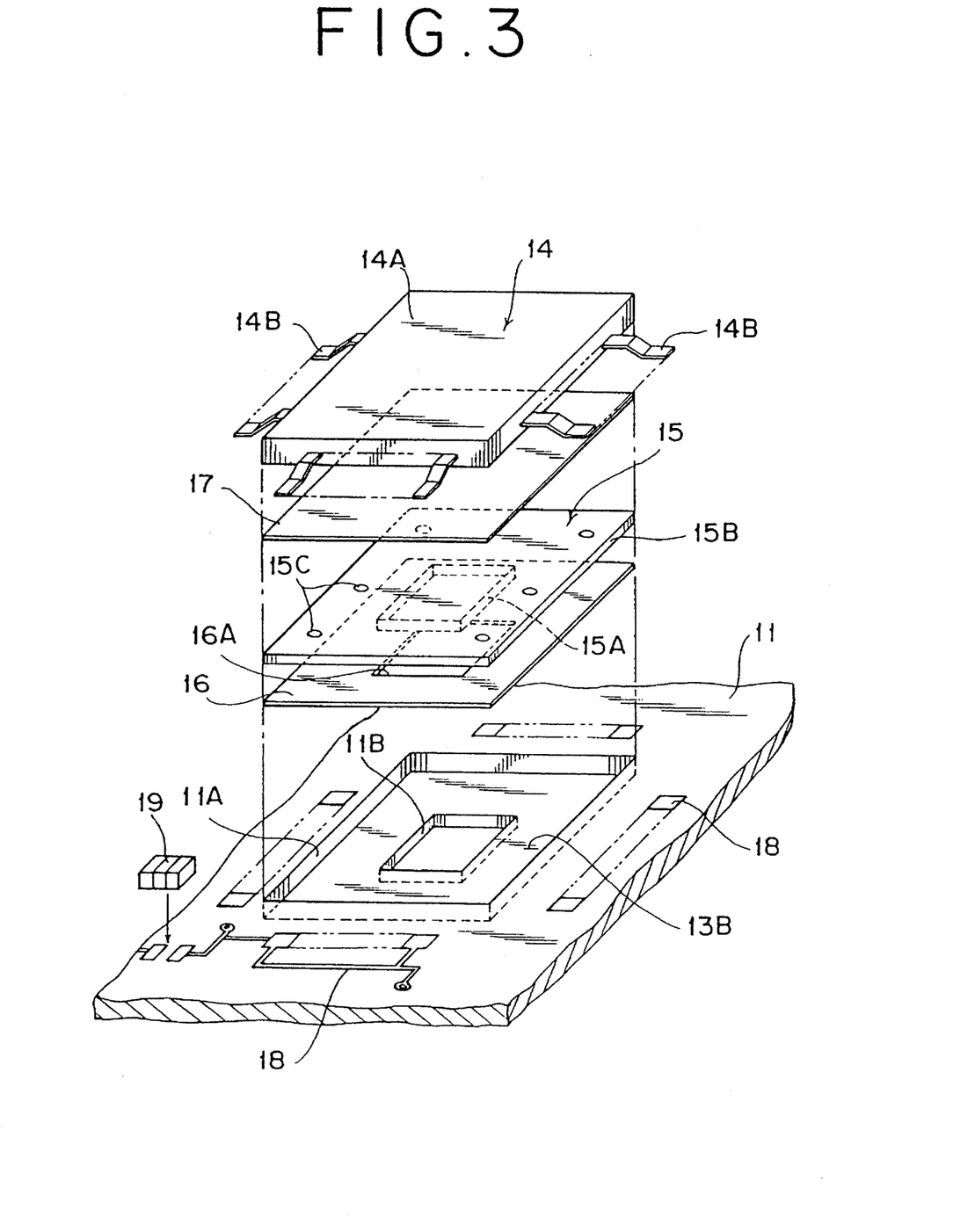
FIG. 3 is an exploded perspective view of the printed circuit board assembly shown in FIG. 2.

FIGS. 2 and 3 show a printed circuit board assembly according to a second preferred embodiment of the present invention. Referring to FIGS. 2 and 3, reference numeral 11 denotes a printed circuit board. The printed circuit board 11 is a multi-layer printed circuit board formed by alternately layering insulation layers 12A, 12B and 12C and conductor layers (layers including wiring patters such as a ground pattern and a signal patter) 13A, 13B, 13C and 13D.

The printed circuit board 11 has a recess 11A formed thereon by removing part of the semiconductor 13A on the surface side and the insulation layer 12A, and a through-hole 11B formed substantially at the center of a bottom wall of the recess 11A. Part of the conductor layer 13B is exposed on the bottom face of the recess 11A of the printed circuit board 11. It is to be noted that, in the present embodiment, the partially exposed conductor layer 13B is a ground pattern which itself is grounded. Reference numeral 14 denotes an LSI (heat generating part) mounted on the printed circuit board 11. The LSI 14 has a rectangular package 14A and a plurality of leads 14B extending from side faces of the package 14A. The recess 11A and the through-hole 11B of the printed circuit board 11 are provided corresponding to the package 14A at a position where the LSI 14 is to be mounted.

Reference numeral 15 denotes a heat radiation member made of alumina ceramics. The heat radiation member 15 has a projection 15A extending through the through-hole 11B of the printed circuit board 11, and a mounting portion 15B provided around the projection 15A for contacting with the bottom face of the recess 11A. The face of the heat radiation member 15 remote from the projection 15A is formed as a flat face which is substantially in register with the surface of the printed circuit board 11, and the rear face of the package 14A of the LSI 14 is adhered to the face of the heat radiation member 15. The end face of the projection 15A of the heat radiation member 15 is formed as a flat face which is substantially in register with the rear face of the printed circuit board 11. Further, a plurality of through-holes 15C are formed in the mounting portion 15B of the heat radiation member 15.

Here, a process of manufacturing the printed circuit board assembly will be described with reference to FIG. 3. First, a rectangular solder sheet 16 having, at a central portion thereof, a through-hole 15A corresponding to the through-hole 11B is inserted into the recess 11A of the printed circuit board 11. Then, the heat radiation member 15 is arranged such that the projection 15A thereof extends through the through-hole 11B of the printed circuit board 11 and the mounting portion 15B is contacted with the bottom face of the recess 11A of the printed circuit board 11 (that is, the exposed portion of the conductor 13B) with the solder sheet 16 interposed therebetween.

Then, another rectangular solder sheet 17 is placed onto the heat radiation member 15, and the LSI 14 is placed onto the solder sheet 17 such that the package 14A thereof corresponds to the solder sheet 17 and the leads 14B thereof correspond to predetermined portions (lands) of wiring patterns 18 of the conductor layer 13A on the printed circuit board 11. Further, also the other electronic part or parts 19 are placed at predetermined positions of the wiring patterns 18 on the printed circuit board 11. Then, these component parts for the printed circuit board assembly are heated in a high temperature environment to melt the solder sheets 16 and 17 and are then cooled to cause the solder to solidify. It is to be noted that solder is plated or solder cream is applied in advance to predetermined portions of the wiring patterns formed on the surface of the printed circuit board 11 on which electronic parts are to be mounted.

Consequently, the LSI 14 is mounted on the printed circuit board 11 in a condition wherein it is adhered to the heat radiation member 15 with the solder 20 interposed therebetween as seen in FIG. 2. According to the present embodiment, since the LSI 14 is securely mounted on the heat radiation member 15 by means of the solder 20, possible deterioration of the heat radiation property as time passes is reduced. Further, since heat generated by the LSI 14 is radiated to the air by way of the heat radiation member 15 and radiated also to the conductor layer 13B by way of the mounting portion 15B of the heat radiation member 15, the heat radiation property is enhanced. Furthermore, the thickness of the printed circuit board assembly will not be increased by the heat radiation member 15.

In addition, since the plurality of through-holes 15C are formed in the mounting portion 15B of the heat radiation member 15, the rear face of the LSI 14 and the conductor layer 13B on the bottom face of the recess 11A of the printed circuit board 11 are electrically connected to each other by way of the solder 20 and wiring lines for grounding the LSI 14 can be provided simultaneously, and consequently, the wiring efficiency can be improved. It is to be noted that, where the heat radiation member 15 is formed from a metal material, even if through-holes are not formed at the mounting portion of the radiation member 15, a similar effect to that of the through-holes can be obtained.

Third Embodiment

Figure 4:
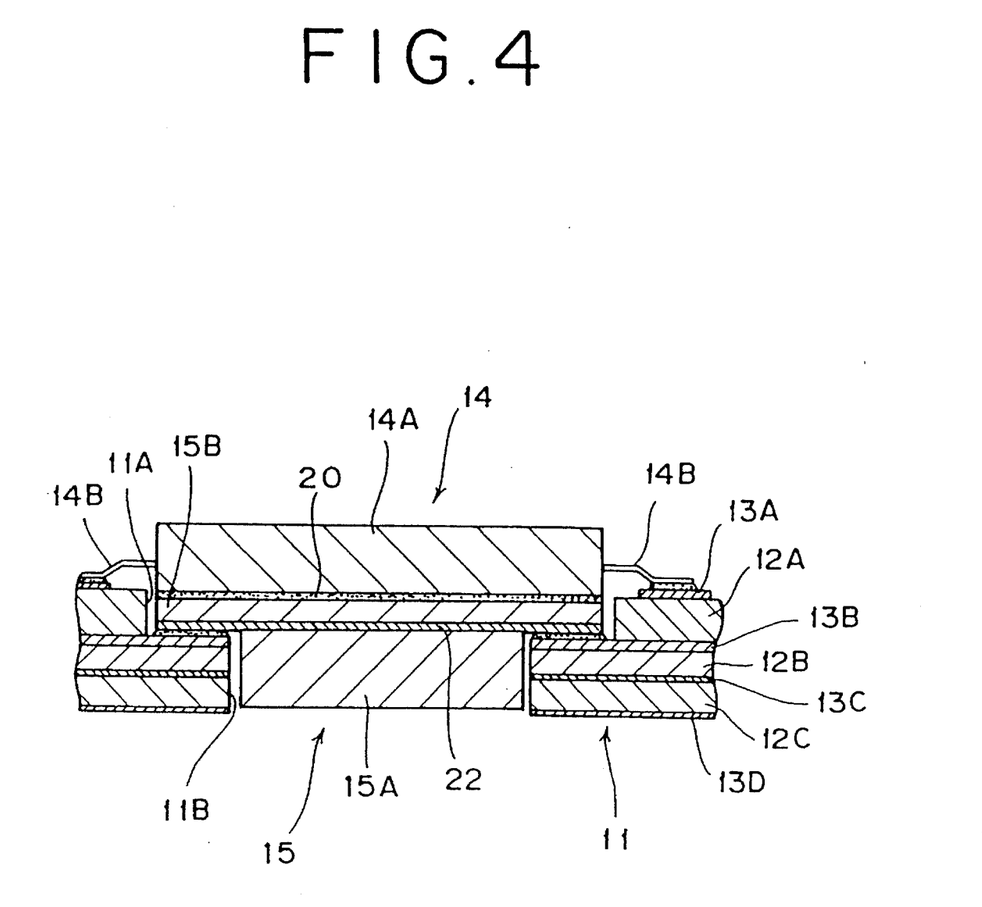
FIG. 4 is a schematic sectional view of a further printed circuit board assembly showing a third preferred embodiment of the present invention.
Figure 5:
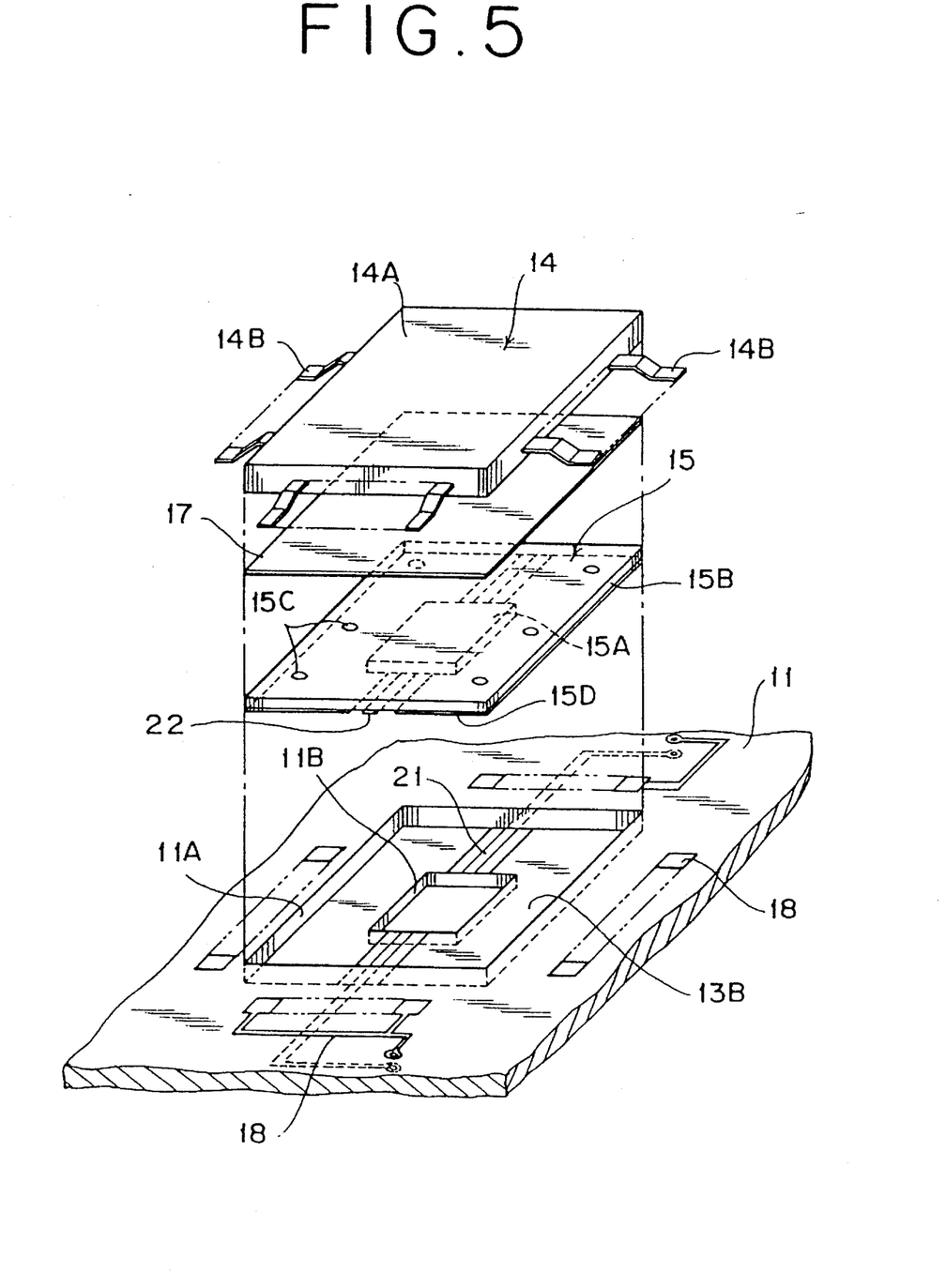
FIG. 5 is an exploded perspective view of the printed circuit board assembly shown in FIG. 4.

FIGS. 4 and 5 show a printed circuit board assembly according to a third preferred embodiment of the present invention. In FIGS. 4 and 5, like elements to those of the second embodiment shown in FIGS. 2 and 3 are denoted by like reference numerals, and only different elements will be described below.

Referring to FIGS. 4 and 5, the conductor layer 13B exposed to the bottom face of the recess 11A of the printed circuit board 11 has a signal pattern which is cut or separated by the through-hole 11B. Meanwhile, a signal pattern 22 is formed on the projection 15A of the heat radiation member 15 such that it extends through a base portion of the projection 15A. When the heat radiation member 15 is mounted on the printed circuit board 11, the portions of the signal pattern 21 of the printed circuit board 11 separated by the through-hole 11B are complemented by the signal pattern 22 of the heat radiation member 15.

Due to the construction described above, possible reduction of the wiring efficiency caused by the recess 11A and the through-hole 11B formed on the printed circuit board 11 in order to mount the heat radiation member 15 on the printed circuit board 11 can be reduced. It is to be noted that, in the present embodiment, the solder sheet 16 in the second embodiment is not employed, but plated solder 15D is provided on the wiring patterns including the signal pattern 22 on the mounting portion 15B of the heat radiation member 15.

Figure 6:
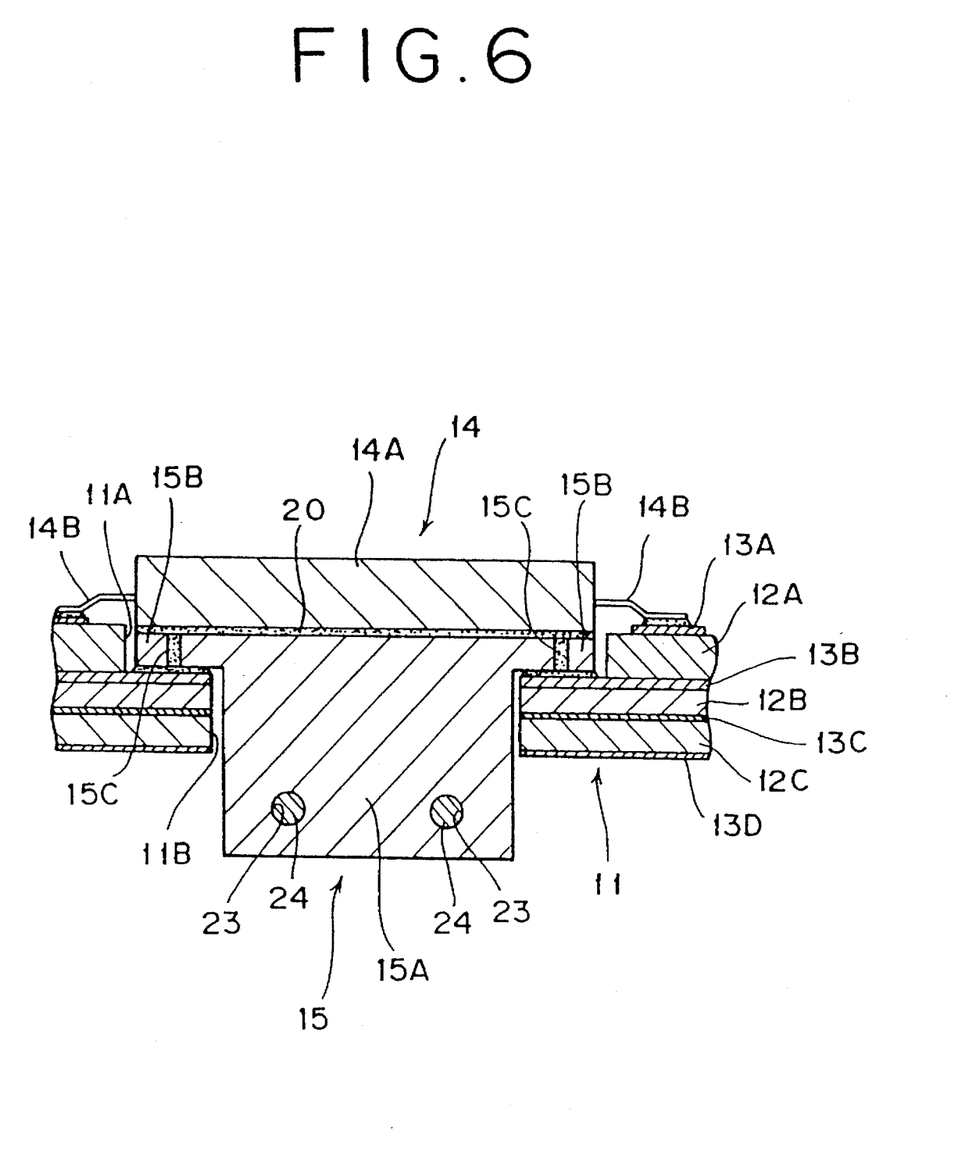
FIG. 6 is a schematic sectional view of a still further printed circuit board assembly showing a fourth preferred embodiment of the present invention.
Figure 7:
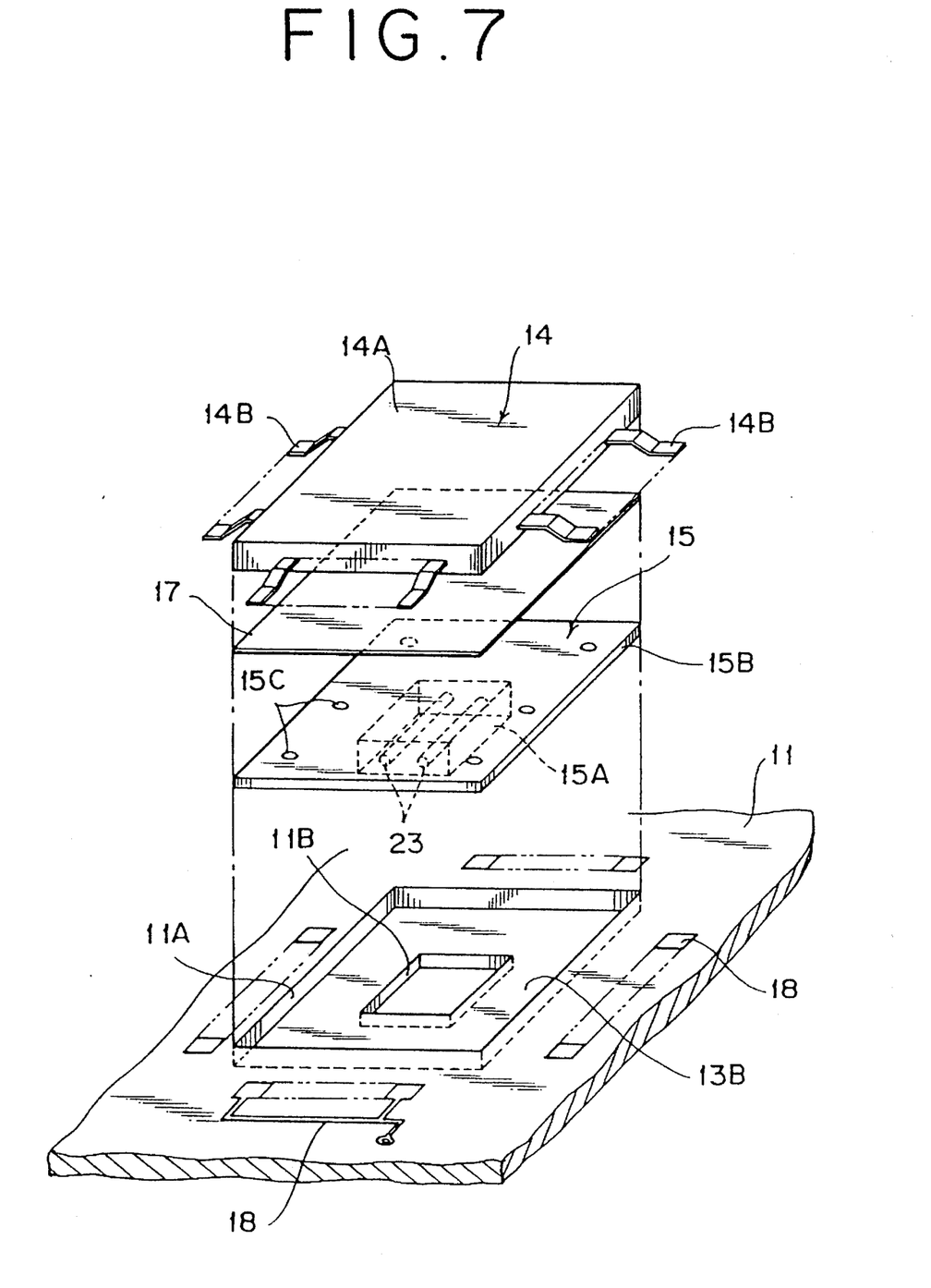
FIG. 7 is an exploded perspective view of the printed circuit board assembly shown in FIG. 6.
Figure 8:
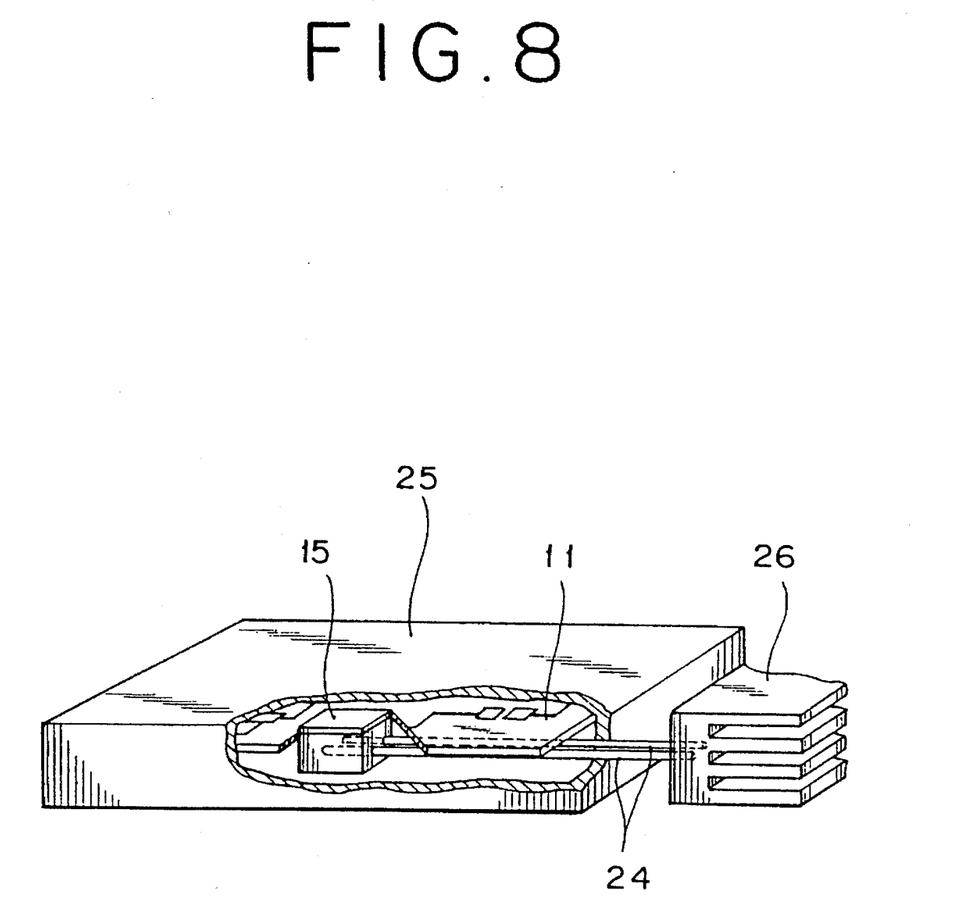
FIG. 8 is a perspective view, partly broken, of the printed circuit board assembly shown in FIG. 6.

Meanwhile, where the heat radiation member 15 is formed from a metal material, the wiring patterns including the signal pattern 22 formed on the heat radiation member 15 can be formed on a glass epoxy resin layer coated on the surface of the heat radiation member 15. Further, the wiring efficiency can be further enhanced if the wiring pattern including the signal patterns 22 formed on the heat radiation member 15 are arranged not only on the surface of the heat radiation member 15 but also in the inside of the heat radiation member 15 which is formed as a multilayer member. cl Fourth Embodiment FIGS. 6 to 8 show a printed circuit board assembly according to a fourth preferred embodiment of the present invention. In FIGS. 6 to 8, like elements to those of the second embodiment described hereinabove with reference to FIGS. 2 and 3 are denoted by like reference numerals, and description will be given only to different elements.

Referring to FIGS. 6 to 8, in the present embodiment shown, the projection 15A of the heat radiation member 15 is formed longer than that in the second embodiment such that, when the heat radiation member 15 is mounted on the printed circuit board 11, the end of the projection 15A extends outwardly from the printed circuit board 11. Further, a pair of through-holes 23 are formed in the projection 15A of the heat radiation member 15. A heat sink pipe 24 is inserted and fixed, at an end thereof, in and to each of the through-holes 23. Each of the heat sink pipes 24 is disposed along the lower face of the printed circuit board 11 as shown in FIG. 8, and the other end of the heat sink pipe 24 extends to the outside of a case 25 for accommodating the printed circuit board assembly therein and a heat radiation fin 26 is mounted on the outer extremity of the heat sink pipe 24.

As such construction is adopted, heat generated from the LSI 14 is transmitted to the heat radiation fin 26 outside the case 25 by way of the heat radiation member 15 and the heat sink pipes 24 and is then radiated from the heat radiation fin 26 to the atmospheric air. Accordingly, the LSI 14 can be cooled efficiently. It is to be noted that, in the present embodiment, the solder sheet 16 in the second embodiment is not used, but an Ag (silver) epoxy bonding agent is applied to a face of the mounting portion 15B of the heat radiation member 15 adjacent the projection 15A or to the exposed portion of the conductor layer 13B of the printed circuit board 11.

Since the printed circuit board assembly of the present invention is constructed in such a manner as described so far, there is an advantage in that stable and efficient heat radiation with respect to time can be achieved without making it difficult to minimize a printed circuit board assembly. Also there is another advantage in that possible deterioration of the wiring efficiency where a structure for heat radiation is adopted can be reduced.

What is claimed is:

1. A printed circuit board assembly, comprising:

a printed circuit board having a recess formed thereon and having a first through-hole formed substantially at the center of a bottom wall of said recess, said printed circuit board having a first signal pattern formed inside thereof and being partially exposed to said bottom wall of said recess and being interrupted by said through-hole;

a heat radiation member mounted in said recess of said printed circuit board, said heat radiation member having a projection fitted in said first through-hole of said printed circuit board and a mounting portion provided around said projection contacting with the bottom wall of said recess, said heat radiation member having a second signal pattern which interconnects said interrupted first signal pattern; and a heat generating part soldered to said heat radiation member.

2. A printed circuit board assembly according to claim 1, wherein said heat radiation member is securely mounted, at said mounting portion thereof, on the bottom wall of said recess of said printed circuit board by means of solder.

3. A printed circuit board assembly according to claim 1, wherein said heat radiation member is securely mounted, at said mounting portion thereof, on the bottom wall of said recess of said printed circuit board by leans of a silver epoxy bonding agent.

4. A printed circuit board assembly according to claim 1, wherein said heat radiation member is made of a metal material.

5. A printed circuit board assembly according to claim 1, wherein said heat radiation member is made of a ceramics material.

6. A printed circuit board assembly according to claim 1, wherein said printed circuit board has a conductor layer formed in the inside thereof, and said conductor layer is partially exposed to the bottom wall of said recess of said printed circuit board.

7. A printed circuit board assembly, comprising:

a printed circuit board having a recess formed thereon and having a first through-hole formed substantially at the center of a bottom wall of said recess;

a heat radiation member mounted in said recess of said printed circuit board, said heat radiation member having a projection fitted in said first through-hole of said printed circuit board and a mounting portion provided around said projection contacting with the bottom wall of said recess; and a heat generating part soldered to said heat radiation member, said printed circuit board having a conductor layer formed inside thereof, said conductor layer being partially exposed to the bottom wall of said recess of said printed circuit board, wherein said heat radiation member has a plurality of second through-holes formed in said mounting portion thereof.

8. A printed circuit board assembly according to claim 7, further comprising a heat sink pipe mounted at an end thereof on said heat radiation member, and a heat radiation fin mounted at the other end of said heat sink pipe.

* * * * *